United States Patent [19]
Kawasaki et al.

[11] Patent Number: 6,066,969
[45] Date of Patent: May 23, 2000

[54] SEMICONDUCTOR DEVICE WITH DLL CIRCUIT AVOIDING EXCESSIVE POWER CONSUMPTION

[75] Inventors: Kenichi Kawasaki; Yasuharu Sato; Hiroyoshi Tomita, all of Kawasaki, Japan

[73] Assignee: Fujitsu Limited, Kanagawa, Japan

[21] Appl. No.: 09/130,168

[22] Filed: Aug. 6, 1998

[30] Foreign Application Priority Data

Jan. 16, 1998 [JP] Japan .................................. 10-006974

[51] Int. Cl.[7] ........................................................ H03L 7/06
[52] U.S. Cl. ............................ 327/156; 327/158; 327/299
[58] Field of Search .................................... 327/147, 148, 327/149, 150, 156, 157, 158, 159, 291, 293, 299

[56] References Cited

U.S. PATENT DOCUMENTS 5,822,255  10/1998  Uchida ..................................... 365/233
5,939,913   8/1999  Tomita ..................................... 327/158
5,955,904   9/1999  Kawasaki ................................. 327/156

Primary Examiner—Timothy P. Callahan
Assistant Examiner—Cassandra Cox
Attorney, Agent, or Firm—Arent, Fox Kintner Plotkin & Kahn

[57] ABSTRACT

A semiconductor device includes a variable-delay circuit which delays an input-clock signal to generate a delay clock signal, a clock-control circuit which selects one of the input-clock signal and the delayed clock signal, an output circuit which outputs data in synchronism with a clock signal selected by the clock-control circuit, and a DLL circuit which adjusts a delay of the variable-delay circuit. The DLL circuit includes a delay-control circuit which adjusts the delay of the variable-delay circuit, and a clock-selection circuit which controls the clock-control circuit to select one of the input-clock signal and the delayed clock signal. The variable-delay circuit is controlled such that the delay is not increased when the input-clock signal is selected by the clock-selection circuit.

10 Claims, 12 Drawing Sheets

FIG. 5A  i-clk 
FIG. 5B  dll-clk 
FIG. 5C  i-clk-div 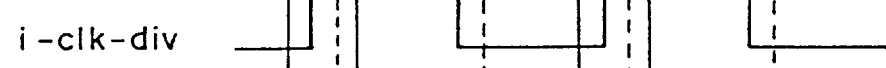
FIG. 5D  dll-clk-div 
PHASE COMPARISON        PHASE COMPARISON

SEMICONDUCTOR DEVICE WITH DLL CIRCUIT AVOIDING EXCESSIVE POWER CONSUMPTION

BACKGROUND OF THE INVENTION

1. Field of the Invention

The present invention generally relates to semiconductor devices, and particularly relates to a semiconductor device equipped with a DLL (delay-locked loop) circuit.

2. Description of the Related Art

Some semiconductor devices control a timing of a clock signal by use of a DLL circuit or the like.

FIG. 1 is a block diagram of a configuration in which a DLL circuit is used as a timing-stabilization circuit for data-output operations.

The configuration of FIG. 1 includes an input circuit 501, a variable-delay circuit 502, a clock-control circuit 503, a signal-line delay 504, an output circuit 505, a frequency divider 506, a phase comparator 507, a delay-control circuit 508, a variable-delay circuit 509, a dummy-clock-control circuit 510, a dummy-signal-line delay 511, a dummy-output circuit 512, a dummy-load circuit 513, a dummy-input circuit 514, and an overflow detector 515.

A clock signal CLK input to the input circuit 501 is compared with a reference voltage, and is supplied from the input circuit 501 as an internal-clock signal i-clk. The internal-clock signal i-clk is delayed by the variable-delay circuit 502 by an appropriate delay amount, and is supplied to the output circuit 505 via the clock-control circuit 503 and the signal-line delay 504. The output circuit 505 uses the internal-clock signal i-clk having the appropriate delay amount as a synchronization signal so as to latch data DATA. The latched data DATA is then supplied from the output circuit 505 to an exterior of the semiconductor device as data DQ.

The signal path from the input point of the clock signal CLK to the output circuit 505 inevitably introduces a delay which is inherent to the circuit, so that the data DATA output from the output circuit 505 to the exterior of the device has a timing displacement relative to the clock signal CLK. In order to ensure that the data DATA output from the output circuit 505 to the exterior of the device is adjusted to have a predetermined timing relation with the externally provided clock signal CLK, a DLL circuit mainly comprised of the phase comparator 507, the delay-control circuit 508, and the variable-delay circuit 509 is employed.

The internal-clock signal i-clk is subjected to frequency division in the frequency divider 506 to generate a dummy-clock signal d-clk and a reference-clock signal c-clk. The dummy-clock signal d-clk having the same phase as the internal-clock signal i-clk is supplied to the variable-delay circuit 509. The variable-delay circuit 509 is controlled to delay the dummy-clock signal d-clk by the same delay amount as that applied by the variable-delay circuit 502. A delayed-dummy-clock signal d-dll-clk output from the variable-delay circuit 509 is then supplied to the dummy-output circuit 512 via the dummy-clock-control circuit 510 and the dummy-signal-line delay 511. The dummy-output circuit 512 emulates the output circuit 505. A clock signal output from the dummy-output circuit 512 is supplied as a dummy-clock signal d-i-clk to the phase comparator 507 via the dummy-load circuit 513 and the dummy-input circuit 514. Here, the dummy-load circuit 513 emulates the output load of the output circuit 505, and the dummy-input circuit 514 has the same delay characteristics as the input circuit 501.

The phase comparator 507 makes a comparison of the reference-clock signal c-clk with the dummy-clock signal d-i-clk in terms of their phases. To ensure that both clock signals have the same phase, the phase comparator 507 controls the delay amount of the variable-delay circuit 509 via the delay-control circuit 508. In this manner, the clock signal output from the dummy-output circuit 512 is adjusted so as to have a predetermined timing relation with the input clock signal CLK.

A total delay of the variable-delay circuit 502, the clock-control circuit 503, the signal-line delay 504, and the output circuit 505 is equal to a total delay of the variable-delay circuit 509, the dummy-clock-control circuit 510, the dummy-signal-line delay 511, and the dummy-output circuit 512. Further, the internal-clock signal i-clk has the same phase as the dummy-clock signal d-clk. Because of this, when the clock signal output from the dummy-output circuit 512 has the predetermined timing relation with the input clock signal CLK, the data DQ output from the output circuit 505 ends up having the same predetermined timing relation with the input clock signal CLK.

When rising edges of the reference-clock signal c-clk are delayed behind corresponding rising edges of the dummy-clock signal d-clk by one cycle of the clock signal CLK, for example, rising edges of the clock signal output from the dummy-output circuit 512 will have the same timing as rising edges of the clock signal CLK. FIG. 2 is a timing chart showing the case in which the rising edges of the clock signal output from the dummy-output circuit 512 has the same timing as the rising edges of the clock signal CLK. In this case, the data DQ is output in synchronism with the rising edges of the clock signal CLK.

In this configuration, even when the characteristics of the input circuit 501, the variable-delay circuit 502, the clock-control circuit 503, the signal-line delay 504, and the output circuit 505 are changed due to variations in a power voltage and/or temperature, the characteristics of the dummy-input circuit 514, the variable-delay circuit 509, the dummy-clock-control circuit 510, the dummy-signal-line delay 511, and the dummy-output circuit 512 also change in the same manner. Because of this, the data DQ output from the output circuit 505 to the exterior of the device always keeps the same timing relation with the input clock signal CLK regardless of a power-voltage variation and/or a temperature variation.

The delay-control circuit 508 detects setting of a delay to a maximum delay when the delay-control circuit 508 is set to the maximum delay. The variable-delay circuits 502 and 509 controlled by the delay-control circuit 508 is comprised of a predetermined number of delay elements connected in series, and there is inevitably a limit to the maximum number of delay elements which can be used. When an attempt is made to increase a delay amount beyond this limit, such an attempt is bound to fail. In this case, the overflow detector 515 generates an overflow signal based on a maximum-delay-detection signal supplied from the delay-control circuit 508. The overflow signal is provided to the clock-control circuit 503.

The clock-control circuit 503 when the overflow signal is supplied selects the internal-clock signal i-clk having bypassed the variable-delay circuit 502 rather than a delayed-clock signal dll-clk supplied from the variable-delay circuit 502. The clock-control circuit 503 then supplies the internal-clock signal i-clk to the output circuit 505 via the signal-line delay 504.

In the configuration of FIG. 1, the reference-clock signal c-clk preferably has a phase thereof adjusted to a predetermined phase relation with the phase of the internal-clock signal i-clk, such that the data DQ from the output circuit 505 is output at a timing delayed behind the rising edges of the clock signal CLK by 1+m (m<1) cycles. When a cycle of the clock signal CLK is 10 ns with m being ¼, for example, the data DQ is output 12.5 ns (2.5 ns on appearance) after a rising edge of the clock signal CLK. When the cycle of the clock signal CLK is extended to 20 ns, for example, the data DQ is output 25 ns (5 ns on appearance) after a rising edge of the clock signal CLK.

When the clock signal CLK has a relatively long cycle as in the latter example, the delayed-clock signal dll-clk from the variable-delay circuit 502 may have a phase which is delayed behind the internal-clock signal i-clk by more than one clock cycle. In such a case, the internal-clock signal i-clk, rather than the delayed-clock signal dll-clk, is selected by the clock-control circuit 503 so as to output the data DQ at a timing based on the internal-clock signal i-clk. By doing so, the data DQ can be output with a delay of 3 ns, for example. Since it is preferable to access the data DQ as early as possible, use of the internal-clock signal i-clk for outputting the data is a desirable measure to be taken when the clock signal CLK has a relatively long cycle.

Where the internal-clock signal i-clk is selected as the delayed-clock signal dll-clk is delayed behind the internal-clock signal i-clk by more than one cycle, excessive consumption of power is resulted. This is because the DLL circuit unduly continues its operations despite the fact that the internal-clock signal i-clk is used for outputting the data DQ.

Further, the continuing operations of the DLL circuit results in the delay amount of the variable-delay circuits 502 and 509 being increased without a justifiable need. In this case, the delay amount needs to be decreased one stage by one stage when a clock signal of a shorter cycle is used in a subsequent operation. This means that an excessively large number of cycles will be necessary before the DLL circuit locks on.

Accordingly, there is a need for a semiconductor device equipped with a DLL circuit which can reduce excessive power consumption, and shorten a time period required for achieving a lock-on condition when a clock signal switches from a longer cycle to a shorter cycle.

SUMMARY OF THE INVENTION

Accordingly, it is a general object of the present invention to provide a semiconductor device which can satisfy the need described above.

It is another and more specific object of the present invention to provide a semiconductor device equipped with a DLL circuit which can reduce excessive power consumption, and shorten a time period required for achieving a lock-on condition when a clock signal switches from a longer cycle to a shorter cycle.

In order to achieve the above objects, a semiconductor device according to the present invention includes a variable-delay circuit which delays an input-clock signal to generate a delay clock signal, a clock-control circuit which selects one of the input-clock signal and the delayed clock signal, an output circuit which outputs data in synchronism with a clock signal selected by the clock-control circuit, and a DLL circuit which adjusts a delay of the variable-delay circuit. The DLL circuit includes a delay-control circuit which adjusts the delay of the variable-delay circuit, and a clock-selection circuit which controls the clock-control circuit to select one of the input-clock signal and the delayed clock signal. The variable-delay circuit is controlled such that the delay is not increased when the input-clock signal is selected by the clock-selection circuit.

In the semiconductor device described above, when the input-clock signal rather than the delayed-clock signal is selected to serve as a synchronization signal for data output, an increment operation of the variable-delay circuit is stopped in the DLL circuit. This makes it possible to reduce power consumption in the DLL circuit, and can shorten a time period required for achieving a lock-on condition when the input-clock signal is subsequently switched to that of a shorter clock cycle.

According to one aspect of the present invention, the semiconductor device is such that the clock-selection circuit compares phases between the input-clock signal and the delayed-clock signal, and selects one which has an earlier phase.

In the semiconductor device described above, a comparison is made between a phase of the input-clock signal and a phase of the delayed-clock signal in order to make a check as to whether the cycle of the input-clock signal is longer than a predetermined clock cycle. Based on this check, a decision can be made as to which one of the clock signals is selected.

According to another aspect of the present invention, the semiconductor device is such that the DLL circuit further includes a frequency divider which applies a frequency division to the input-clock signal, and a loop-control unit which controls the delay-cotnrol circuit through a feedback loop based on a signal obtained by the frequency division, wherein the clock-selection circuit lowers a ratio of the frequency division when the input-clock signal is selected.

In the semiconductor device described above, the ratio of frequency division by the frequency divider is lowered when the input-clock signal, rather than the delayed-clock signal, is selected to serve as a synchronization signal for data output. This achieves a reduction in an excessive power consumption.

According to another aspect of the present invention, the semiconductor device is such that the ratio of the frequency division is lowered when the delay-control circuit sets a maximum delay amount to the variable-delay circuit so as to result in an overflow condition.

In the semiconductor device described above, an excessive power consumption can be avoided when the variable-delay circuit is placed in an overflow condition.

According to another aspect of the present invention, the semiconductor device is such that the clock-selection circuit compares a first timing with a second timing where a first signal indicates the first timing which is delayed behind a predetermined timing of the input-clock signal by a fixed amount of delay, and a second signal indicates the second timing which is delayed behind the predetermined timing of the input-clock signal by a delay proportional to a cycle of the input-clock signal, and selects the input-clock signal when the second timing is behind the first timing.

In the semiconductor device described above, a comparison is made between a time period represented by the fixed amount of delay and a time period proportional to the cycle of the input-clock signal in order to check whether the cycle of the input-clock signal is longer than a predetermined time length. Based on this check, a decision is made as to which one of the clock signals is selected.

According to another aspect of the present invention, the semiconductor device is such that the DLL circuit further includes a frequency divider which applies a frequency division to the input-clock signal, and a loop-control unit which controls the delay-cotnrol circuit through a feedback loop based on a signal obtained by the frequency division, wherein the clock-selection circuit lowers a ratio of the frequency division when the input-clock signal is selected.

In the semiconductor device described above, the ratio of frequency division by the frequency divider is lowered when the input-clock signal, rather than the delayed-clock signal, is selected to serve as a synchronization signal for data output. This achieves a reduction in an excessive power consumption.

According to another aspect of the present invention, the semiconductor device is such that the ratio of the frequency division is lowered when the delay-control circuit sets a maximum delay amount to the variable-delay circuit so as to result in an overflow condition.

In the semiconductor device described above, an excessive power consumption can be avoided when the variable-delay circuit is placed in an overflow condition.

According to another aspect of the present invention, the semiconductor device further includes a fixed-delay circuit which delays a third signal by the fixed amount of delay to generate the first signal, wherein the frequency divider generates the third signal and the second signal.

In the semiconductor device described above, the comparison between the time period represented by the fixed amount of delay and the time period proportional to the cycle of the input-clock signal can be made based on the signals generated by the frequency divider.

According to another aspect of the present invention, a semiconductor device includes a DLL circuit which adjusts a clock timing, a clock-control circuit which selects one of an input-clock signal and a delayed-clock signal adjusted by the DLL circuit, and an output circuit which outputs data in synchronism with a clock signal selected by the clock-control circuit, wherein the variable-delay circuit is controlled such that the delay is not increased when the input-clock signal is selected.

In the semiconductor device described above, when the input-clock signal rather than the delayed-clock signal is selected to serve as a synchronization signal for data output, an increment operation is stopped in the DLL circuit. This makes it possible to reduce power consumption in the DLL circuit, and can shorten a time period required for achieving a lock-on condition when the input-clock signal is subsequently switched to that of a shorter clock cycle.

Other objects and further features of the present invention will be apparent from the following detailed description when read in conjunction with the accompanying drawings.

BRIEF DESCRIPTION OF THE DRAWINGS

FIGS. 5A through 5D are timing charts for explaining operations of the clock-selection circuit;

DESCRIPTION OF THE PREFERRED EMBODIMENTS

In the following, embodiments of the present invention will be described with reference to the accompanying drawings.

Figure 3:
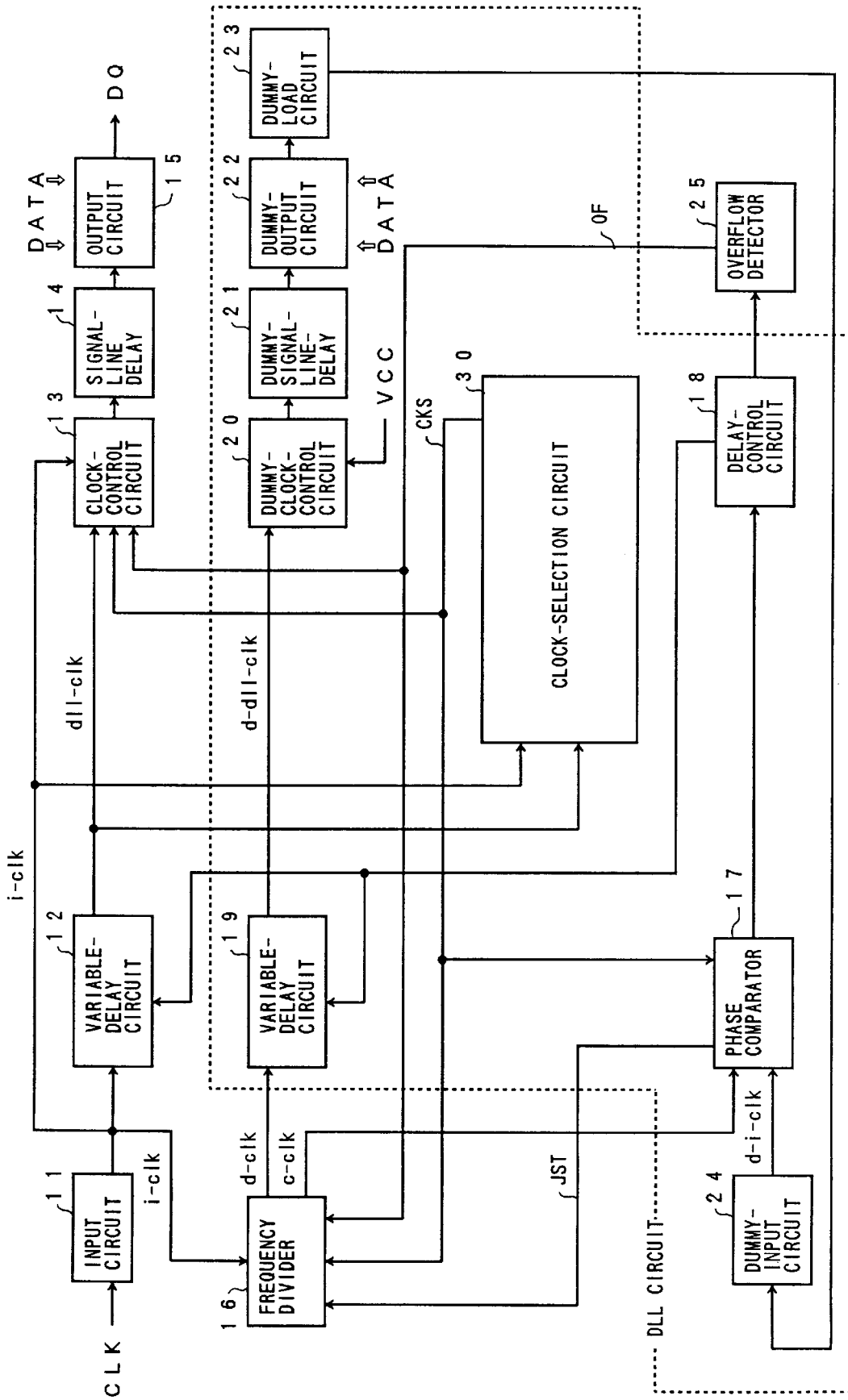
FIG. 3 is a block diagram of an embodiment of a semiconductor device equipped with a DLL circuit according to the present invention.

FIG. 3 is a block diagram of an embodiment of a semiconductor device equipped with a DLL circuit according to the present invention.

The semiconductor device of FIG. 3 includes an input circuit 11, a variable-delay circuit 12, a clock-control circuit 13, a signal-line delay 14, an output circuit 15, a frequency divider 16, a phase comparator 17, a delay-control circuit 18, a variable-delay circuit 19, a dummy-clock-control circuit 20, a dummy-signal-line delay 21, a dummy-output circuit 22, a dummy-load circuit 23, a dummy-input circuit 24, an overflow detector 25, and a clock-selection circuit 30.

A clock signal CLK input to the input circuit 11 is compared with a reference voltage, and is supplied from the input circuit 11 as an internal-clock signal i-clk. The internal-clock signal i-clk is delayed by the variable-delay circuit 12 by an appropriate delay amount, and is supplied to the output circuit 15 via the clock-control circuit 13 and the signal-line delay 14. The output circuit 15 uses the internal-clock signal i-clk having the appropriate delay amount as a synchronization signal so as to latch data DATA. The latched data DATA is then supplied from the output circuit 15 to an exterior of the semiconductor device as data DQ.

The signal path from the input point of the clock signal CLK to the output circuit 15 inevitably introduces a delay which is inherent to the circuit, so that the data DATA output from the output circuit 15 to the exterior of the device has a timing displacement relative to the clock signal CLK. In order to ensure that the data DATA output from the output circuit 15 to the exterior of the device is adjusted to have a predetermined timing relation with the externally provided clock signal CLK, a DLL circuit mainly comprised of the phase comparator 17, the delay-control circuit 18, and the variable-delay circuit 19 is employed.

The internal-clock signal i-clk is subjected to frequency division in the frequency divider 16 to generate a dummy-clock signal d-clk and a reference-clock signal c-clk. The dummy-clock signal d-clk having the same phase as the internal-clock signal i-clk is supplied to the variable-delay circuit 19. The variable-delay circuit 19 is controlled to delay the dummy-clock signal d-clk by the same delay amount as that applied by the variable-delay circuit 12. A delayed-dummy-clock signal d-dll-clk output from the variable-delay circuit 19 is then supplied to the dummy-output circuit 22 via the dummy-clock-control circuit 20 and the dummy-signal-line delay 21. The dummy-output circuit 22 emulates the output circuit 15. A clock signal output from the dummy-output circuit 22 is supplied as a dummy-clock signal d-i-clk to the phase comparator 17 via the dummy-load circuit 23 and the dummy-input circuit 24. Here, the dummy-load circuit 23 emulates the output load of the output circuit 15, and the dummy-input circuit 24 has the same delay characteristics as the input circuit 11.

The phase comparator 17 makes a comparison of the reference-clock signal c-clk with the dummy-clock signal d-i-clk in terms of their phases. To ensure that both clock signals have the same phase, the phase comparator 17 controls the delay amount of the variable-delay circuit 19 via the delay-control circuit 18. In this manner, the clock signal output from the dummy-output circuit 22 is adjusted so as to have a predetermined timing relation with the input clock signal CLK.

A total delay of the variable-delay circuit 12, the clock-control circuit 13, the signal-line delay 14, and the output circuit 15 is equal to a total delay of the variable-delay circuit 19, the dummy-clock-control circuit 20, the dummy-signal-line delay 21, and the dummy-output circuit 22. Further, the internal-clock signal i-clk has the same phase as the dummy-clock signal d-clk. Because of this, when the clock signal output from the dummy-output circuit 22 has the predetermined timing relation with the input clock signal CLK, the data DQ output from the output circuit 15 ends up having the same predetermined timing relation with the input clock signal CLK.

In this configuration, even when the characteristics of the input circuit 11, the variable-delay circuit 12, the clock-control circuit 13, the signal-line delay 14, and the output circuit 15 are changed due to variations in a power voltage and/or temperature, the characteristics of the dummy-input circuit 24, the variable-delay circuit 19, the dummy-clock-control circuit 20, the dummy-signal-line delay 21, and the dummy-output circuit 22 also change in the same manner. Because of this, the data DQ output from the output circuit 15 to the exterior of the device always keeps the same timing relation with the input clock signal CLK regardless of a power-voltage variation and/or a temperature variation.

The delay-control circuit 18 detects setting of a delay to a maximum delay when the delay-control circuit 18 is set to the maximum delay. The variable-delay circuits 12 and 19 controlled by the delay-control circuit 18 is comprised of a predetermined number of delay elements connected in series, and there is inevitably a limit to the maximum number of delay elements which can be used. When an attempt is made to increase a delay amount beyond this limit, such an attempt is bound to fail. In this case, the overflow detector 25 generates an overflow signal OF based on a maximum-delay-detection signal supplied from the delay-control circuit 18. The overflow signal OF is provided to the clock-control circuit 13.

The clock-control circuit 13 when the overflow signal OF is supplied selects the internal-clock signal i-clk having bypassed the variable-delay circuit 12 rather than a delayed-clock signal dll-clk supplied from the variable-delay circuit 12. The clock-control circuit 13 then supplies the internal-clock signal i-clk to the output circuit 15 via the signal-line delay 14.

The clock-selection circuit 30 compares phases between the internal-clock signal i-clk and the delayed-clock signal dll-clk. This comparison is made, when a given cycle of the internal-clock signal i-clk is considered, between a corresponding cycle of the delayed-clock signal dll-clk delayed by the variable-delay circuit 12 and a next cycle of the internal-clock signal i-clk. In this manner, a check is made as to whether the delayed-clock signal dll-clk is delayed behind the internal-clock signal i-clk by more than one cycle. When a delay of more than one cycle is observed, the clock-selection circuit 30 sets a clock-selection signal CKS to HIGH. The clock-selection signal CKS is supplied to the clock-control circuit 13, the frequency divider 16, and the phase comparator 17.

When the clock-selection signal CKS becomes HIGH, the clock-control circuit 13 performs the same operation as when the overflow signal is detected. Namely, the clock-control circuit 13 selects the internal-clock signal i-clk having bypassed the variable-delay circuit 12 rather than the delayed-clock signal dll-clk supplied from the variable-delay circuit 12, and supplies the internal-clock signal i-clk to the output circuit 15 via the signal-line delay 14.

The frequency divider 16 lowers a ratio of frequency division when the clock-selection signal CKS becomes HIGH. Alternately, the frequency divider 16 may stop a frequency-division operation thereof. By doing so, the DLL circuit can avoid excessive power consumption thereof when the internal-clock signal i-clk, rather than the delayed-clock signal dll-clk, is selected to output the data DQ based on the timing of the internal-clock signal i-clk.

When the clock-selection signal CKS becomes HIGH, the phase comparator 17 prompts the delay-control circuit 18 to stop an increment operation thereof. Namely, the delay-control circuit 18 usually adjusts the delay amount of the variable-delay circuits 12 and 19 based on the phase-comparison results of the phase comparator 17, but stops an increment operation thereof for extending the delay amount of the variable-delay circuits 12 and 19 when the clock-selection signal CKS becomes HIGH. This can avoid excessive power consumption, and eliminates a need to spend an excessive number of cycles before achieving a lock-on condition when the clock signal switches from a longer clock cycle to a shorter clock cycle.

The overflow signal OF from the overflow detector 25 is also supplied to the frequency divider 16. Upon receiving the overflow signal OF, the frequency divider 16 lowers a ratio of the frequency division. In this manner, the DLL circuit can avoid excessive power consumption when the internal-clock signal i-clk, rather than the delayed-clock signal dll-clk, is selected upon detection of overflow so as to output the data DQ at a timing based on the internal-clock signal i-clk.

Figure 4:
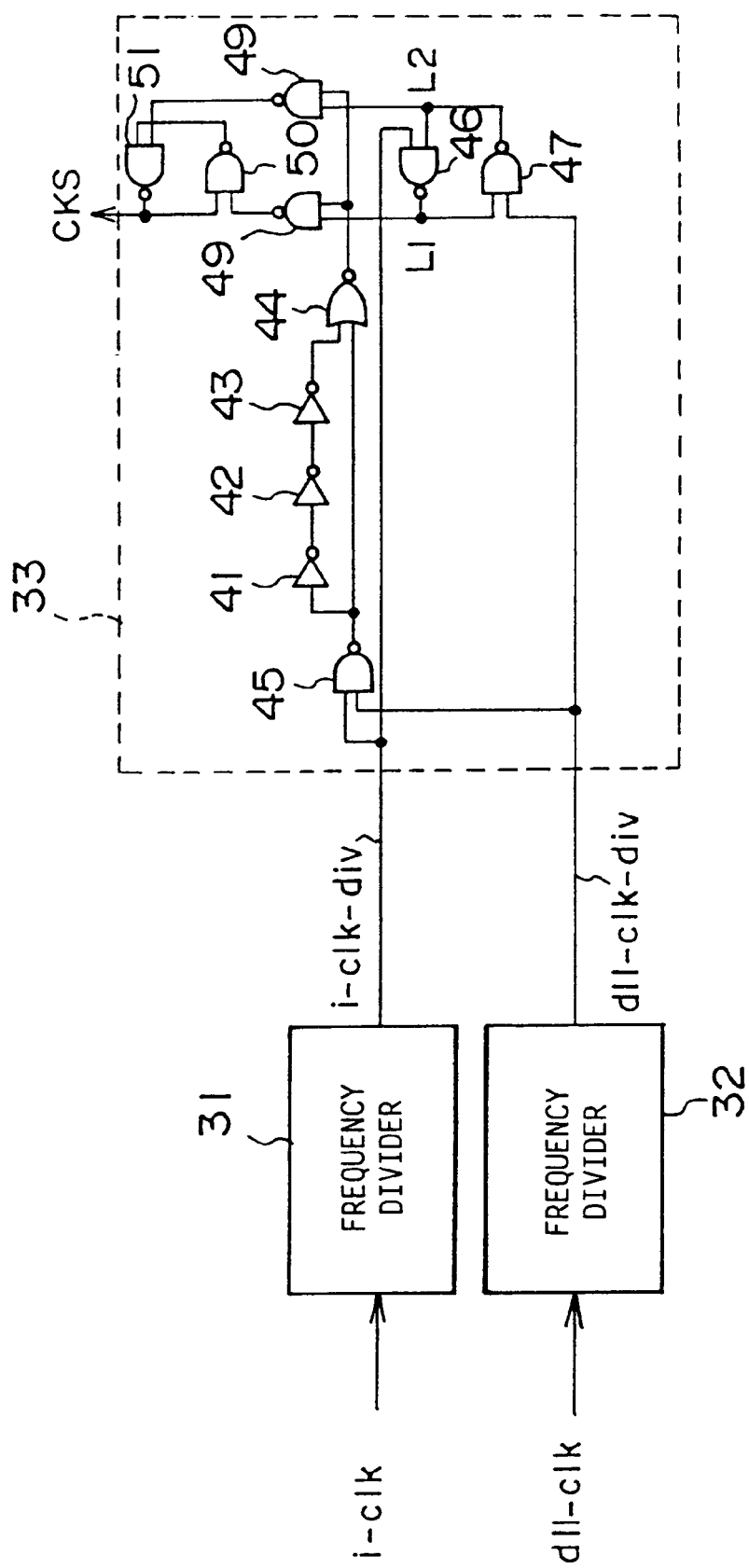
FIG. 4 is a circuit diagram showing a circuit configuration of a clock-selection circuit.

FIG. 4 is a circuit diagram showing a circuit configuration of the clock-selection circuit 30.

The clock-selection circuit 30 of FIG. 4 includes a frequency divider 31, a frequency divider 32, and a phase comparator 33. The frequency divider 31 receives the internal-clock signal i-clk from the input circuit 11, and divides a frequency thereof by n. The frequency divider 32 receives the delayed-clock signal dll-clk from the variable-delay circuit 12, and performs a 1/n-frequency division on the delayed-clock signal dll-clk. Configurations of the frequency dividers are well within the scope of the present invention, and a description thereof will be omitted.

The phase comparator 33 includes inverters 41 through 43, a NOR circuit 44, and NAND circuits 45 through 51.

The phase comparator 33 receives a signal i-clk-div obtained after a frequency division of the internal-clock signal i-clk and a signal dll-clk-div obtained after a frequency division of the delayed-clock signal dll-clk, and checks which one of the signals i-clk-div and dll-clk-div has a rising edge ahead of the other.

Where a rising edge of the signal i-clk-div is ahead of the other, for example, a latch comprised of the NAND circuits 46 and 47 latches a rising edge of the signal i-clk-div, so that outputs L1 and L2 of the latch becomes LOW and HIGH, respectively. When both signals i-clk-div and dll-clk-div subsequently become HIGH, an output of the NAND circuit 45 becomes LOW, so that the NOR circuit 44 outputs a HIGH signal for a predetermined time period. The HIGH output of the NOR circuit 44 opens gates comprised of the NAND circuits 48 and 49, resulting in the inverses of the latch outputs L1 and L2 being supplied to a latch comprised of the NAND circuits 50 and 51. As a result, an output CKS of the latch comprised of the NAND circuits 50 and 51 becomes HIGH.

In this manner, the clock-selection signal CKS becomes HIGH when a rising edge of the signal i-clk-div is ahead of a corresponding rising edge of the signal dll-clk-div.

When a rising edge of the signal dll-clk-div is ahead of the other, on the other hand, the latch outputs L1 and L2 become HIGH and LOW, respectively. The clock-selection signal CKS in this case is thus LOW.

FIGS. 5A through 5D are timing charts for explaining operations of the clock-selection circuit 30.

As shown in the figures, the internal-clock signal i-clk is divided in terms of a frequency thereof by half, for example, to generate the signal i-clk-div. By the same token, the delayed-clock signal dll-clk is subjected to a ½-frequency division to generate the signal dll-clk-div. The signals i-clk-div and dll-clk-div are compared with each other in terms of phases of their rising edges, and a check is made as to which one of the signals is ahead of the other. Based on the check results, the clock-selection signal CKS is controlled. FIGS. 5A through 5D show a case where the phase of the internal-clock signal i-clk is ahead.

Figure 6:
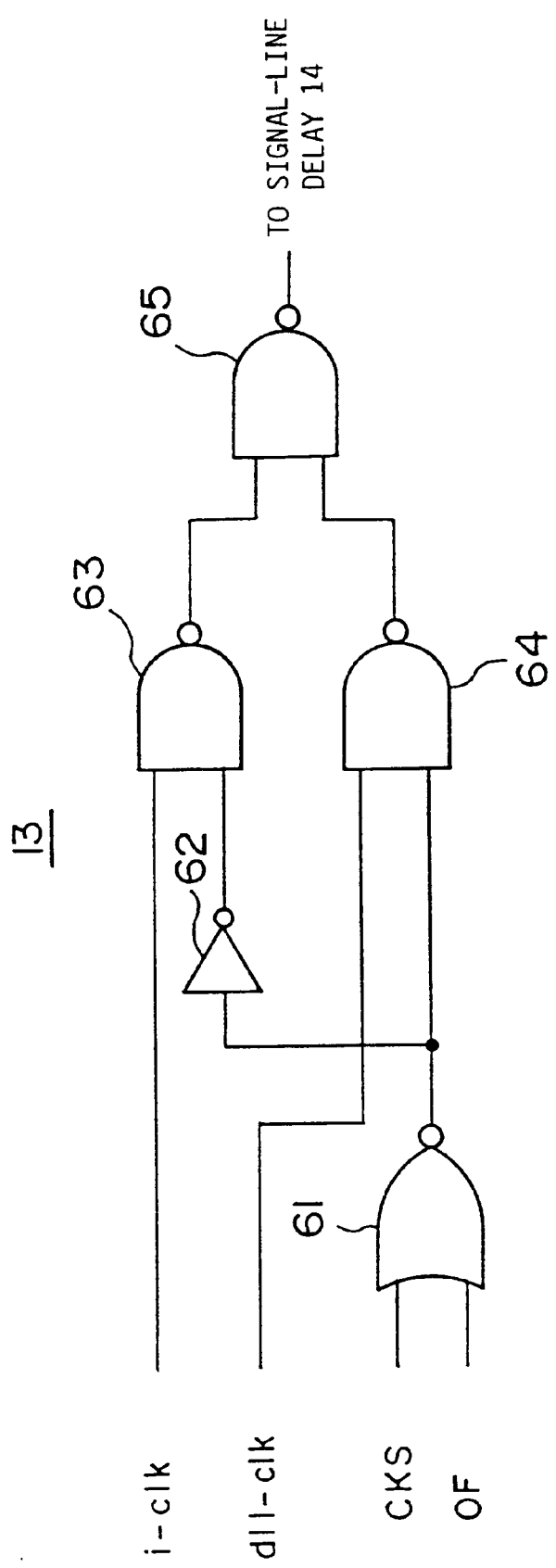
FIG. 6 is a circuit diagram showing a circuit configuration of a clock-control circuit.

FIG. 6 is a circuit diagram showing a circuit configuration of the clock-control circuit 13.

The clock-control circuit 13 of FIG. 6 includes a NOR circuit 61, an inverter 62, and NAND circuits 63 through 65. When either the clock-selection signal CKS or the overflow signal OF input to the NOR circuit 61 becomes HIGH, an output of the inverter 62 changes to HIGH. This results in the selection of the internal-clock signal i-clk, which is then supplied to the signal-line delay 14. Where both the clock-selection signal CKS and the overflow signal OF are LOW, the delayed-clock signal dll-clk is selected, and is supplied to the signal-line delay 14.

Figure 7:
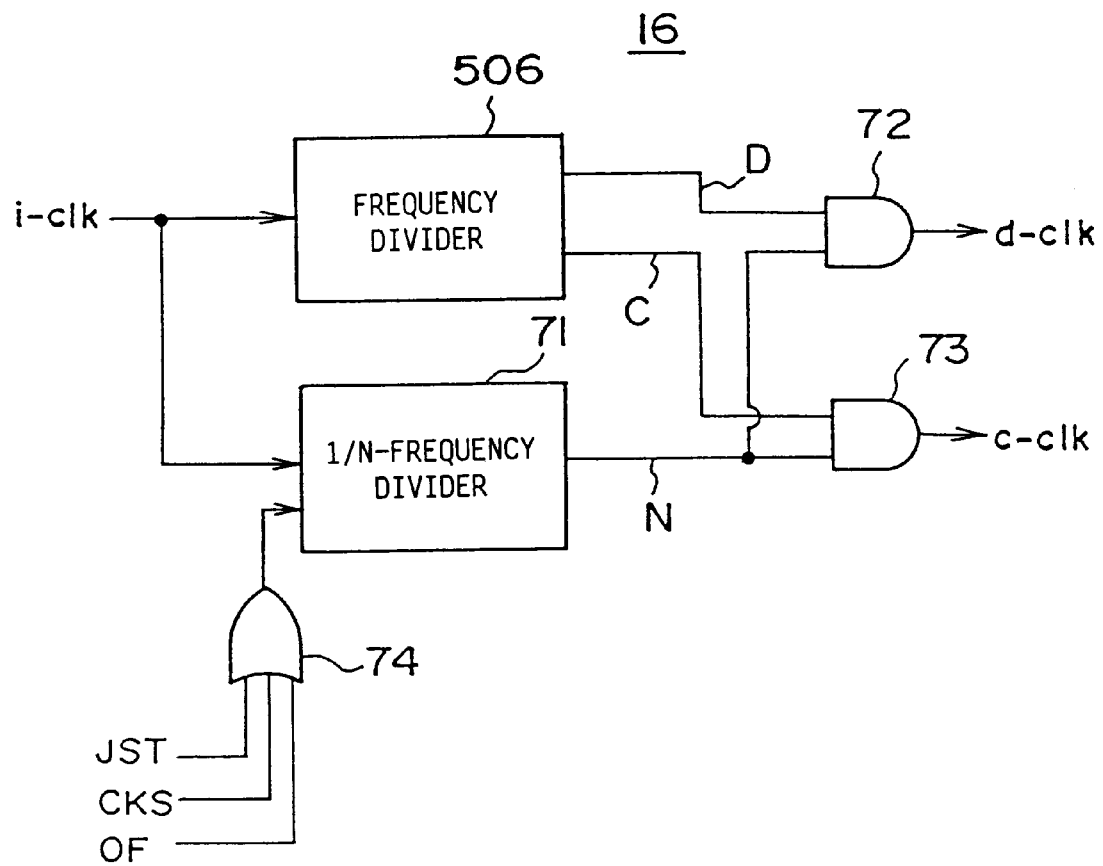
FIG. 7 is a block diagram showing a configuration of a frequency divider.

FIG. 7 is a block diagram showing a configuration of the frequency divider 16.

Figure 1:
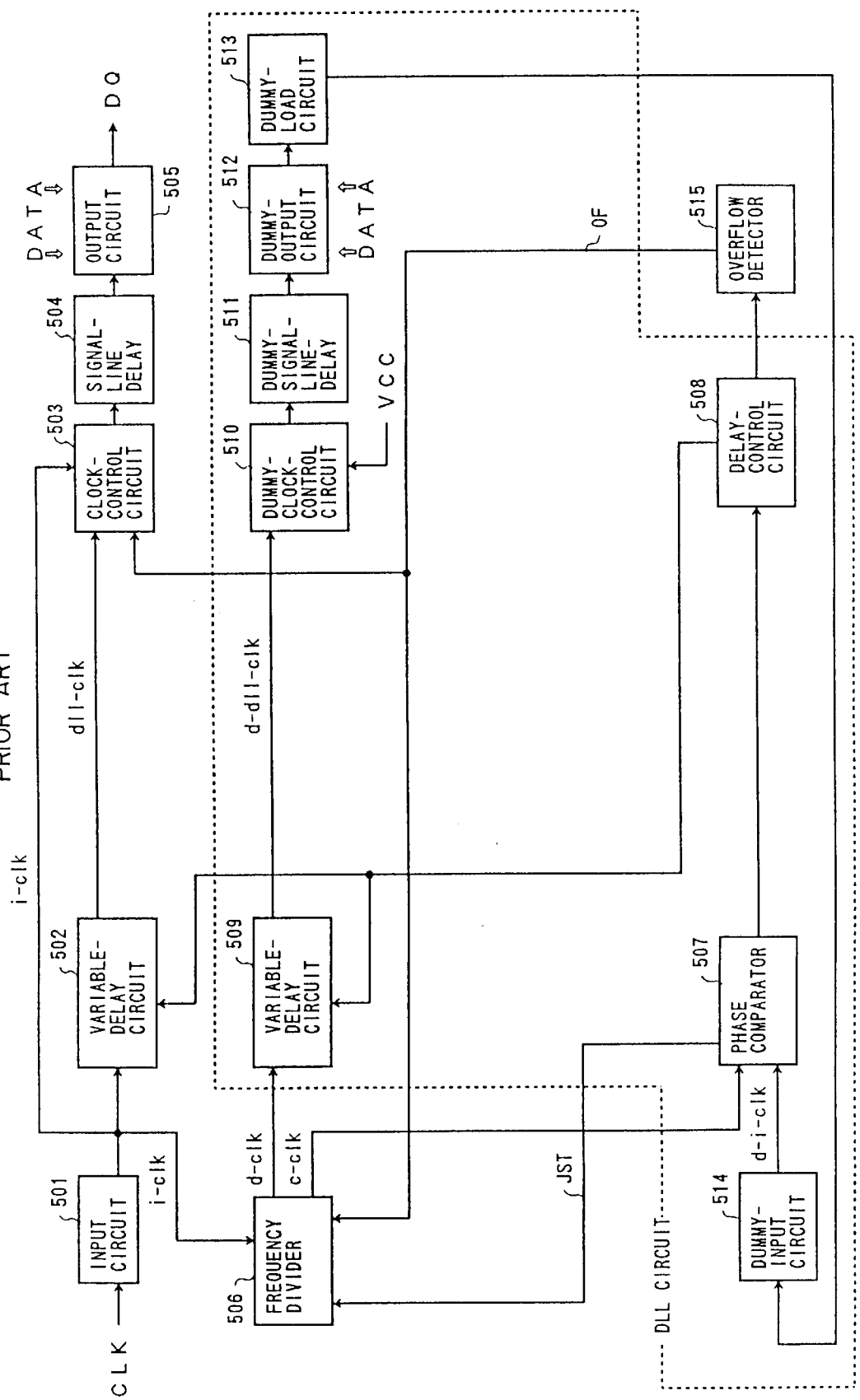
FIG. 1 is a block diagram of a related-art configuration in which a DLL circuit is used as a timing-stabilization circuit for data-output operations.
Figure 2:
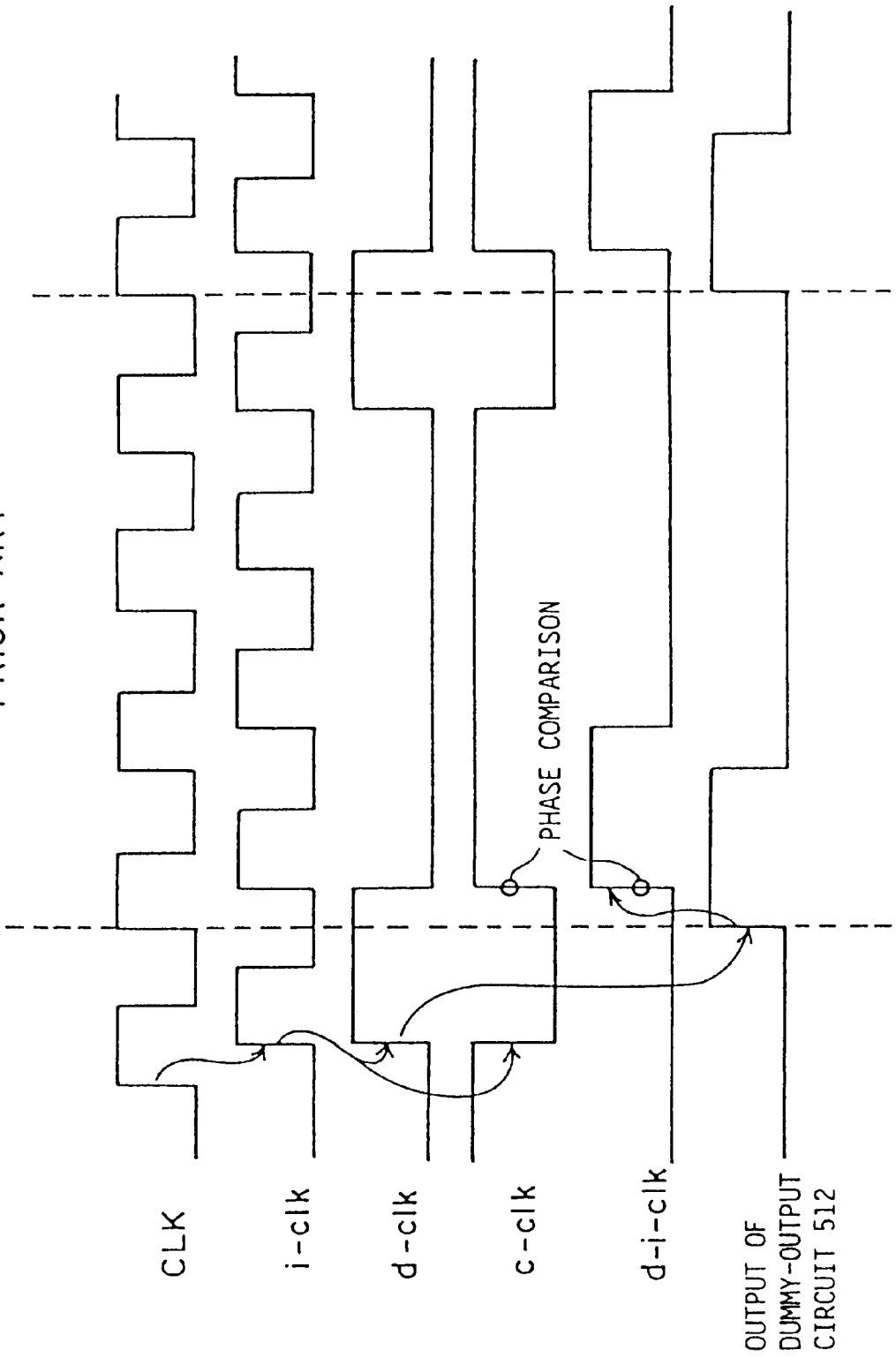
FIG. 2 is a timing chart showing a case in which rising edges of a clock signal output from a dummy-output circuit has the same timing as rising edges of an input clock signal.

The frequency divider 16 of FIG. 7 includes the frequency divider 506 of FIG. 1, a 1/n-frequency divider 71, AND circuits 72 and 73, and an OR circuit 74.

The 1/n-frequency divider 71 is a conventional frequency divider which divides a frequency of the internal-clock signal i-clk by n, and operates when either one of a lock-on signal JST, the clock-selection signal CKS, and the overflow signal OF, all of which are input to the OR circuit 74, is changed to HIGH. Here, the lock-on signal JST changes to HIGH when the DLL circuits locks on, and a description thereof will be provided later. When the 1/n-frequency divider is not in operation, an output N of the 1/n-frequency divider is fixed to HIGH.

FIGS. 8A through 8F are timing charts for explaining operations of the frequency divider 16.

Figure 8:
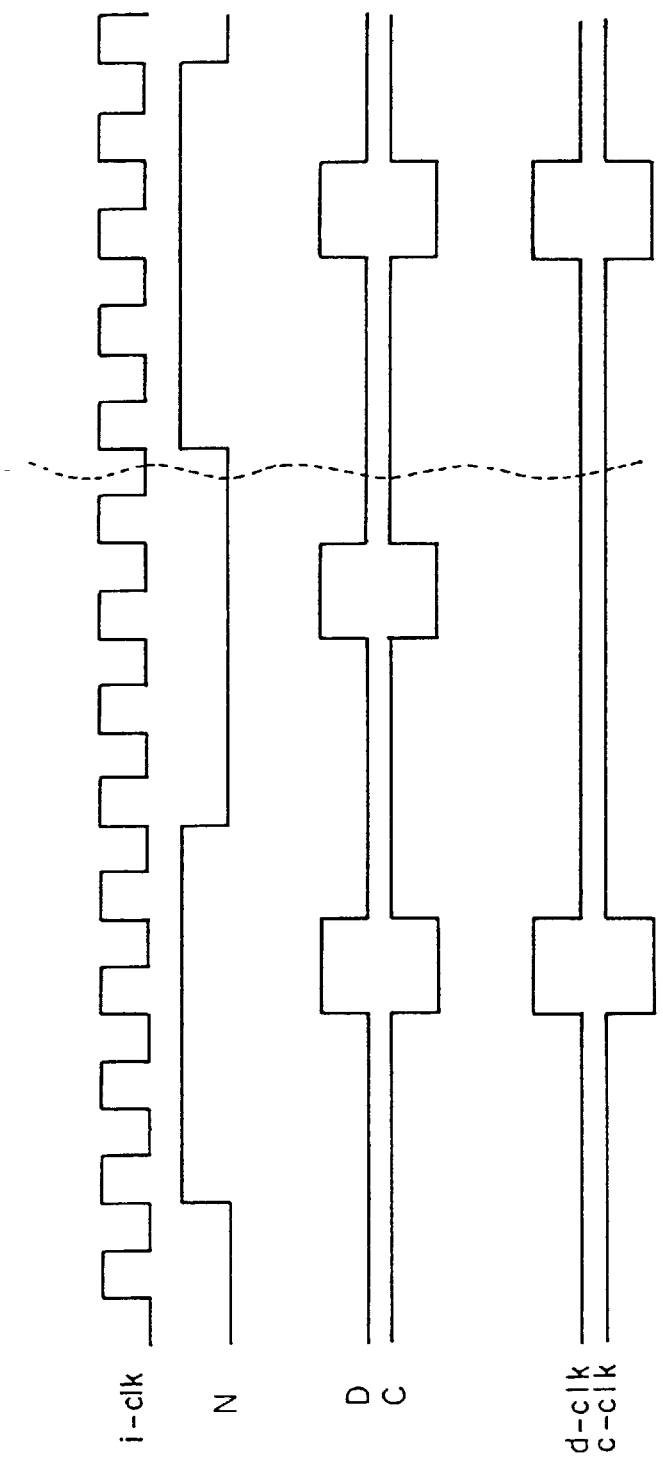
FIGS. 8A through 8F are timing charts for explaining operations of the frequency divider.

With reference to FIG. 7, the frequency divider 506 outputs frequency-divided signals D and C. The frequency-divided signals D and C are the same as the dummy-clock signal d-clk and the reference-clock signal c-clk, respectively, when the 1/n-frequency divider 71 is not in operation (i.e., when the output N is fixed to HIGH). As shown in FIG. 8B, operations of the 1/n-frequency divider 71 results in the output N switching between HIGH and LOW at a cycle n times as long as that of the internal-clock signal i-clk. Only when the output N is HIGH, do the AND circuits 72 and 73 output the frequency-divided signals D and C as the dummy-clock signal d-clk and the reference-clock signal c-clk, respectively.

In this manner, the ratio of frequency division by the frequency divider 16 is lowered when either one of the lock-on signal JST, the clock-selection signal CKS, and the overflow signal OF is changed to HIGH.

Figure 9:
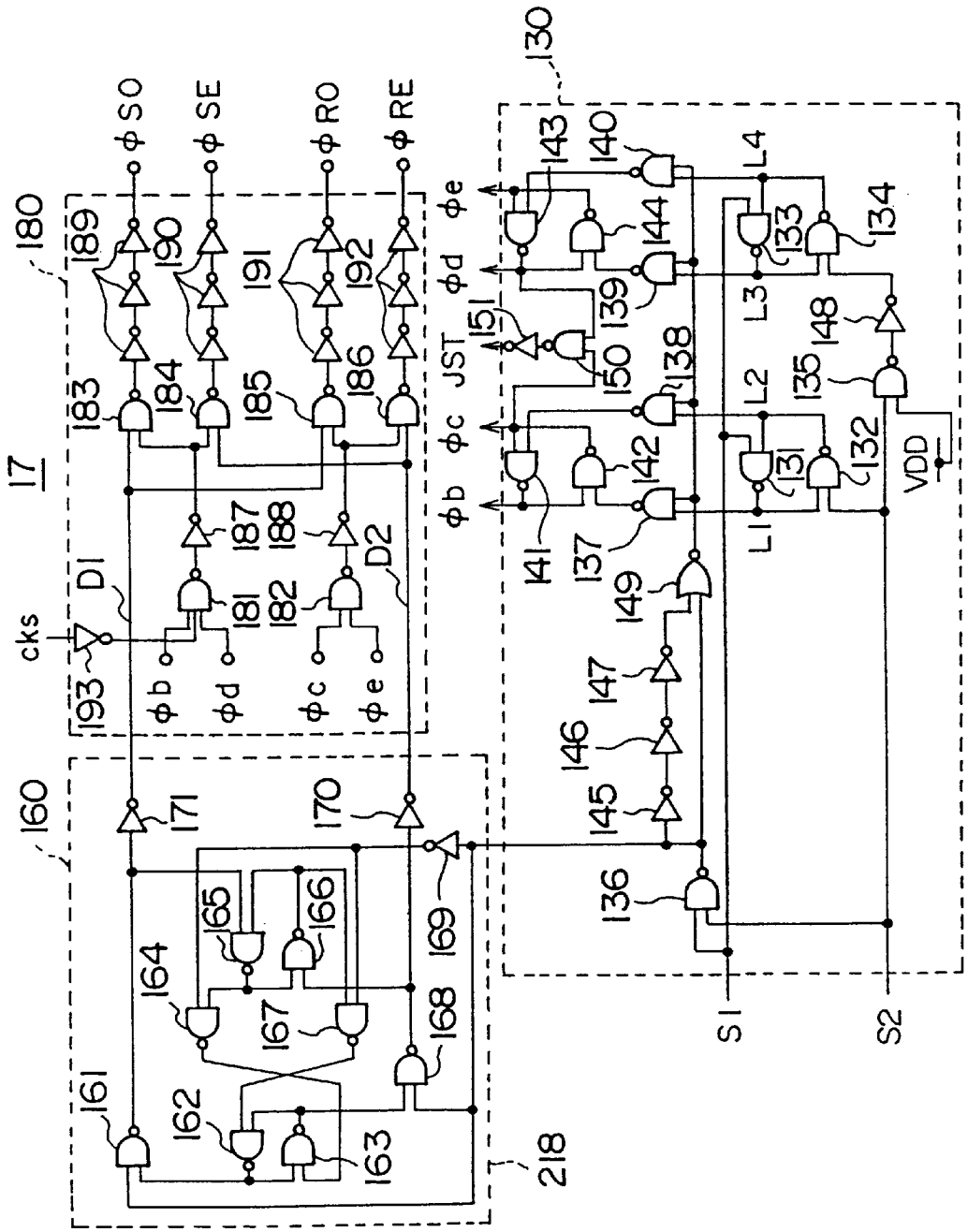
FIG. 9 is a circuit diagram showing a circuit configuration of a phase comparator.

FIG. 9 is a circuit diagram showing a circuit configuration of the phase comparator 17.

The phase comparator 17 of FIG. 9 includes an edge-timing-comparison circuit 130, a binary counter 160, and a pulse-generation circuit 180.

The edge-timing-comparison circuit 130 includes NAND circuits 131 through 144, inverters 145 through 148, a NOR circuit 149, a NAND circuit 150, and an inverter 151. The binary counter 160 includes NAND circuits 161 through 168 and inverters 169 through 171. The pulse-generation circuit 180 includes NAND circuits 181 through 186, a plurality of inverters 187 through 192, and an inverter 193.

The edge-timing-comparison circuit 130 receives input signals S1 and S2, and determines which one of the input signals S1 and S2 has a rising edge ahead of the other. The input signal S1 corresponds to the dummy-clock signal d-i-clk from the dummy-input circuit 24 (see FIG. 3), and the input signal S2 corresponds to the reference-clock signal c-clk from the frequency divider 16.

If a rising edge of the input signal S1 is ahead of a rising edge of the input signal S2, a latch comprised of the NAND circuits 131 and 132 produces outputs L1 and L2 which are LOW and HIGH, respectively. Also, a latch formed by the NAND circuits 133 and 134 generates output L3 and L4 which are LOW and HIGH, respectively.

After this, both of the input signals S1 and S2 become HIGH, which changes an output of the NAND circuit 136 to LOW. This prompts the NOR circuit 149 to produce a HIGH output for a predetermined period of time. The HIGH output of the NOR circuit 149 opens gates of the NAND circuits 137 through 140, so that the latch outputs L1 through L4 are inverted and input to two latches comprised of NAND circuits 141 through 144. The latch comprised of NAND circuits 141 and 142 thus has outputs Φb and Φc which are HIGH and LOW, respectively. Also, the latch comprised of NAND circuits 143 and 144 has outputs Φd and Φe which are HIGH and LOW, respectively.

In this manner, when the input signal S1 has a rising edge ahead in time, the NAND circuit 181 of the pulse-generation circuit 180 changes an output thereof to LOW. Here, if the clock-selection signal CKS is HIGH, the output of the NAND circuit 181 remains at a HIGH level.

When a rising edge of the input signal S2 is ahead of a rising edge of the input signal S1 by a sufficient margin, the latch outputs Φb and Φc become LOW and HIGH, respectively, and, also, the latch outputs Φd and Φe become LOW and HIGH, respectively. In this case, therefore, the NAND circuit 182 of the pulse-generation circuit 180 changes an output thereof to LOW.

When a rising edge of the input signal S2 is ahead of a rising edge of the input signal S1 only by a small margin, the latch comprised of the NAND circuits 133 and 134 produces the outputs L3 and L4 which are LOW and HIGH, respectively, because of a signal delay introduced by the NAND circuit 135 and the inverter 148. In this case, the latch outputs Φb and Φc are LOW and HIGH, respectively, whereas the latch outputs Φd and Φe are HIGH and LOW, respectively. The NAND circuits 181 and 182 of the pulse-generation circuit 180 thus do not change outputs thereof, and these outputs remain at the HIGH level.

In this manner, when a difference in rising-edge timings is small between the input signal S1 and the input signal S2, i.e., when the rising edges can be regarded as having the same timing, the phase-comparison circuit 17 of FIG. 9 does not generate the outputs ΦSO, ΦSE, ΦRO, and ΦRE.

The binary counter 160 divides a frequency of a signal by half when receiving the signal from the NAND circuit 136 of the edge-timing-comparison circuit 130. The binary counter 160 outputs a frequency-divided signal D1 from the inverter 171, and outputs a frequency-divided signal D2 from the inverter 170. The frequency-divided signal D2 is an inverse of the frequency-divided signal D1. The signal from the NAND circuit 136 has the same cycle as the input signals S1 and S2. Because of this, the frequency-divided signal D1 output from the binary counter 160 becomes HIGH during even-number cycles of the input signals, for example. In this case, the frequency-divided signal D2 becomes HIGH during odd-number cycles.

In the pulse-generation circuit 180, the output of the NAND circuit 181 becomes LOW when the input signal S1 is ahead of the input signal S2, as previously described. On the other hand, when the input signal S2 is ahead in time by a sufficient margin, the output of the NAND circuit 182 becomes LOW.

When the input signal S1 is ahead in time, the output of the NAND circuit 181 is inverted by the inverter 187, and is supplied to the NAND circuit 183 and 184 as a HIGH signal. The NAND circuit 183 further receives the frequency-divided signal D1, and the NAND circuit 184 further receives the frequency-divided signal D2. In this case, therefore, the pulse-generation circuit 180 generates HIGH pulses as the signal ΦSE or the signal ΦSO in turn.

When the input signal S2 is ahead in time by a sufficient margin, the output of the NAND circuit 182 is inverted by the inverter 188, and is supplied to the NAND circuit 185 and 186 as a HIGH signal. The NAND circuit 185 further receives the frequency-divided signal D1, and the NAND circuit 186 further receives the frequency-divided signal D2. In this case, therefore, the pulse-generation circuit 180 generates HIGH pulses as the signal ΦRO and the signal ΦRE in turn.

These signals ΦSE, ΦSO, ΦRE, and ΦRO are supplied to the delay-control circuit 18 shown in FIG. 3. When the dummy-clock signal d-i-clk is ahead with regard to time, the signals ΦSO and ΦSE are supplied to the delay-control circuit 18 so as to increase the delay amount. When the reference-clock signal c-clk is ahead in the time, the signals ΦRO and ΦRE are supplied to the delay-control circuit 18, thereby decreasing the delay amount.

Where the clock-selection signal CKS is HIGH, however, the output of the NAND circuit 181 is fixed to HIGH, as previously described, so that the signals ΦSO and ΦSE remain at the LOW level. In this case, the delay-control circuit 18 does not increase the delay amount of the variable-delay circuits 12 and 19.

Figure 10:
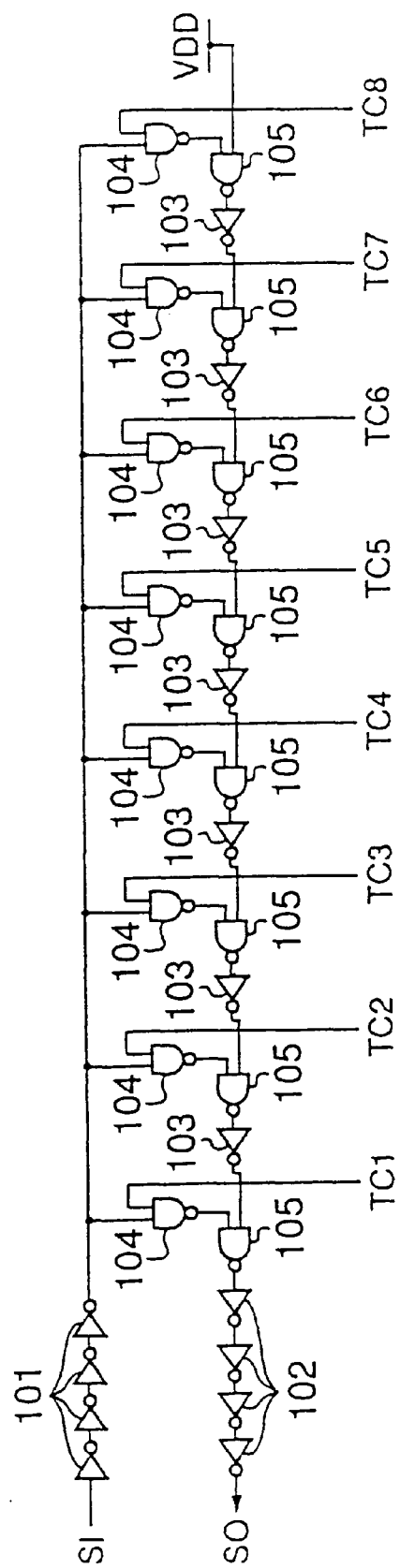
FIG. 10 is a circuit diagram showing a circuit structure of a variable-delay circuit.

FIG. 10 is a circuit diagram showing a circuit structure of a variable-delay circuit. The variable-delay circuit of FIG. 10 is used as each of the variable-delay circuits 12 and 19 in FIG. 3.

The variable-delay circuit of FIG. 10 includes a plurality of inverters 101, a plurality of inverters 102, a plurality of inverters 103, a plurality of NAND circuits 104, and a plurality of NAND circuits 105. A given one of the inverters 103 and a corresponding one of the NAND circuits 105 together form one stage of a delay element, such that the plurality of inverters 103 and the plurality of NAND circuits 105 together form a series of delay elements having a plurality of delay stages. Control signals TC1 through TC8 are supplied to the NAND circuits 104, and are provided from the delay-control circuit 18. A detailed description of the control signals TC1 through TC8 will be provided later. For the understanding of the circuit operations of FIG. 10, it should be pointed out that only two adjacent signals are HIGH among the control signals TC1 through TC8, and the remaining control signals are LOW.

An input signal S1 is supplied to the plurality of NAND circuits 104 via the plurality of inverters 101. The input signal S1 passes through a given one of the NAND circuits 104 when this NAND circuit 104 receives a HIGH signal as one of the control signals TC1 through TC8, and enters the series of delay elements comprised of the plurality of inverters 103 and the plurality of NAND circuits 105. The input signal SI propagates through the series of delay elements, and is output as an output signal SO after passing through the plurality of inverters 102. Depending on a position of the two adjacent signals which are HIGH among the control signals TC1 through TC8, the input signal SI passes through a different number of delay stages. Control of this position makes it possible to adjust how much the input signal SI is delayed.

Figure 11:
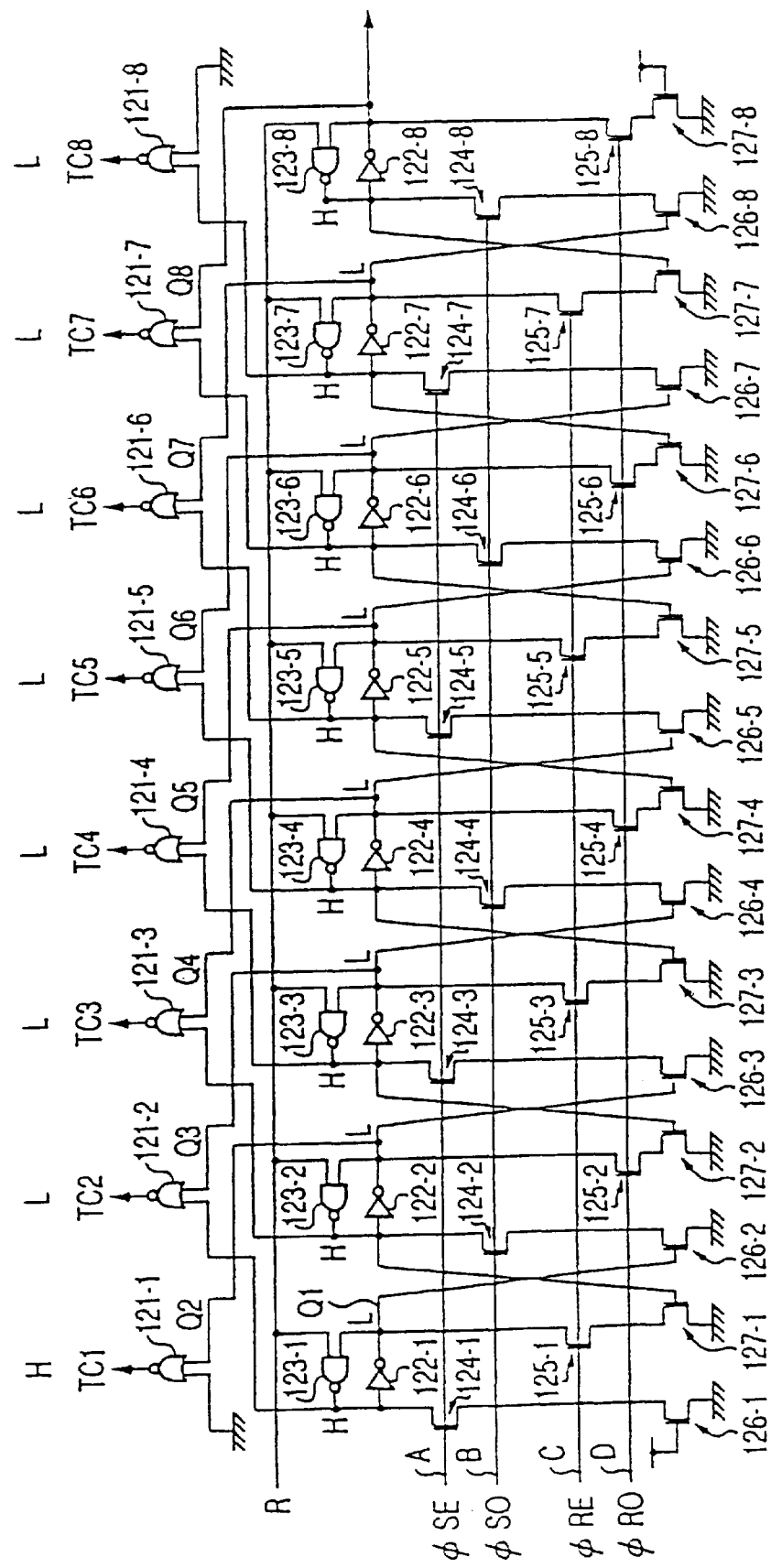
FIG. 11 is a circuit diagram showing a circuit configuration of a delay-control circuit.

FIG. 11 is a circuit diagram showing a circuit configuration of the delay-control circuit 18. The delay-control circuit 18 generates the control signals TC1 through TC8 described above.

The delay-control circuit 18 includes NOR circuits 121-1 through 121-8, inverters 122-1 through 122-8, NAND circuits 123-1 through 123-8, NMOS transistors 124-1 through 124-8, NMOS transistors 125-1 through 125-8, NMOS transistors 126-1 through 126-8, and NMOS transistors 127-1 through 127-8. When a reset signal R is turned to LOW, the delay-control circuit 18 is reset. Namely, when the reset signal R becomes LOW, outputs of the NAND circuits 123-1 through 123-8 become HIGH, and outputs of the inverters 122-1 through 122-8 become LOW. A pair of a given one of the NAND circuits 123-1 through 123-8 and a corresponding one of the inverters 122-1 through 122-8 forms a latch in which one element of the pair receives an output of the other element as an input. An initial state created by the reset signal R is thus kept even after the reset signal R returns to HIGH.

In this initial state, the output TC1 of the NOR circuit 121-1 is HIGH as shown in FIG. 11, and the remaining NOR circuits 121-2 through 121-8 have the outputs TC2 through TC8, respectively, which are LOW. That is, only the output TC1 is HIGH among the outputs TC1 through TC8.

When there is a need to increase the amount of delay with respect to a signal subjected to phase adjustment, HIGH pulses are supplied to signal lines A and B in turn. With a HIGH pulse of the signal ΦSE supplied to the signal line A, the NMOS transistor 124-1 is turned on. Since the NMOS transistor 126-1 is in a turned-on state, an output of the NAND circuit 123-1 is connected to the ground, and is forced to change from HIGH to LOW, so that an output of the inverter 122-1 becomes HIGH. This condition is latched by the latch comprising the NAND circuit 123-1 and the inverter 122-1. As a result, the output TC2 is changed from LOW to HIGH. In this condition, therefore, only the outputs TC1 and TC2 are HIGH.

With a HIGH pulse of the signal ΦSO supplied to the signal line B, the NMOS transistor 124-2 is turned on. Since the NMOS transistor 126-2 is already in a turned-on state, an output of the NAND circuit 123-2 is connected to the ground, and is forced to change from HIGH to LOW, so that an output of the inverter 122-2 becomes HIGH. This condition is latched by the latch comprising the NAND circuit 123-2 and the inverter 122-2. As a result, the output TC1 is changed from HIGH to LOW, while the output TC3 is turned from LOW to HIGH. In this condition, therefore, only the outputs TC2 and TC3 are HIGH.

As described above, HIGH pulses are supplied in turn to the signal lines A and B to shift a position to the right one by one when this position marks the only two HIGH outputs among the outputs TC1 through TC8.

When there is a need to decrease the delay amount, HIGH pulses are supplied to signal lines C and D in turn. Operations in this case are simply a reverse of the above-described operations, and a description thereof will be omitted. The output signals TC1 through TC8 generated in this manner are supplied to the variable-delay circuit so as to adjust a delay of a signal when this signal is subjected to a phase adjustment.

As can be understood from the description of the delay-control circuit 18, the output of the inverter 122-8 changes to HIGH when a pulse of the signal ΦSO is supplied to the signal line B, while the control signals TC7 and TC8 are HIGH among the control signals TC1 through TC8, in order to increase the delay amount further so that the control signal TC7 is changed to LOW. This situation represents an occurrence of overflow in the delay-control circuit 18. Namely, the output of the inverter 122-8 can be used for the purpose of checking whether overflow is present. The output of the inverter 122-8 is supplied to the overflow detector 25 (FIG. 3), where the overflow signal OF is generated based on this output. As for signal logic to generate the overflow signal OF, the overflow signal OF has the same logic as that of the output from the inverter 122-8.

Figure 12:
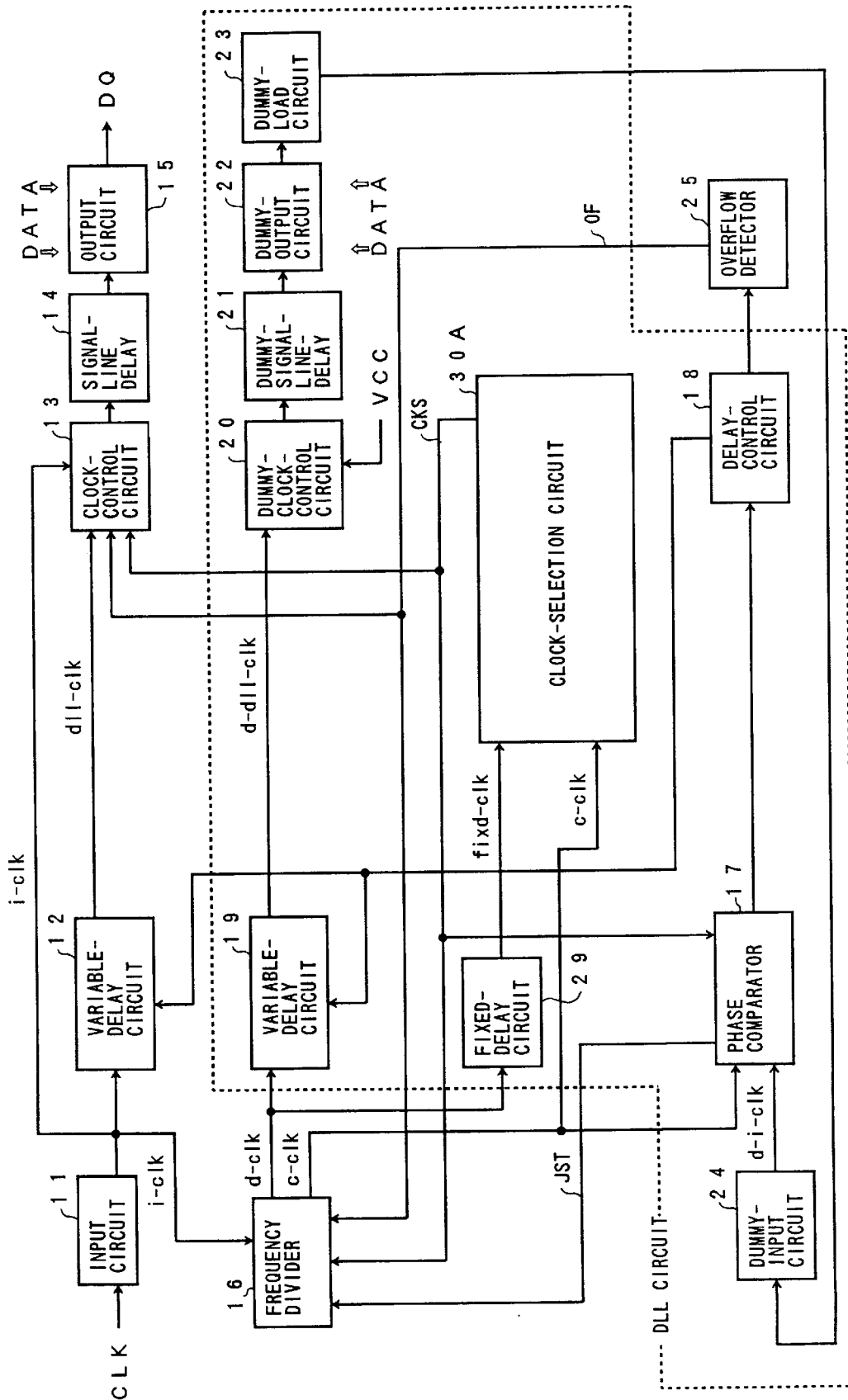
FIG. 12 is a block diagram of another embodiment of a semiconductor device which is equipped with a DLL circuit according to the present invention.

FIG. 12 is a block diagram of another embodiment of a semiconductor device which is equipped with a DLL circuit according to the present invention. In FIG. 12, the same elements as those of FIG. 3 are referred to by the same numerals, and a description thereof will be omitted.

The semiconductor device of FIG. 12 includes a clock-selection circuit 30A in place of the clock-selection circuit 30 of FIG. 3, and further includes a fixed-delay circuit 29. The fixed-delay circuit 29 delays the dummy-clock signal d-clk supplied from the frequency divider 16 by a fixed delay amount so as to generate a fixed-delay-clock signal fixd-clk. The fixed-delay circuit 29 has a conventional structure comprised of a series of delay elements, and a description thereof will be omitted.

The clock-selection circuit 30A may have the same configuration as the phase comparator 33 shown in FIG. 4, and compares phases of rising edges between the fixed-delay-clock signal fixd-clk and the reference-clock signal c-clk. The fixed delay of the fixed-delay circuit 29 can be set to an appropriate delay amount such that a rising edge of the reference-clock signal c-clk can be always ahead of a rising edge of the fixed-delayed-clock signal fixd-clk when the clock signal CLK has a relatively short clock cycle. As the cycle of the clock signal CLK is extended beyond a given limit, the rising edge of the reference-clock signal c-clk will come behind the rising edge of the fixed-delay-clock signal fixd-clk. A comparison of rising-edge phases between the reference-clock signal c-clk and the fixed-delay-clock signal fixd-clk, therefore, allows a check to be made as to whether the cycle of the clock signal CLK is longer than a predetermined cycle.

It should be noted that the check can be made with regard to the cycle of the clock signal CLK because of the nature of the reference-clock signal c-clk and the fixed-delay-clock signal fixd-clk. That is, the reference-clock signal c-clk and the fixed-delay-clock signal fixd-clk are generated such that a rising edge of the former signal is delayed behind a corresponding rising edge of the latter signal by a delay amount proportional to the cycle of the clock signal CLK.

The clock-selection circuit 30A in this manner checks whether the cycle of the clock signal CLK is longer than the predetermined cycle, and generates the clock-selection signal CKS based on the results of the check. The generated clock-selection signal CKS is supplied to the clock-control circuit 13, the frequency divider 16, and the phase comparator 17 in the same manner as in the previous embodiment shown in FIG. 3.

Further, the present invention is not limited to these embodiments, but various variations and modifications may be made without departing from the scope of the present invention.

What is claimed is:

1. A semiconductor device comprising:
    a variable-delay circuit which delays an input-clock signal to generate a delay clock signal;
    a clock-control circuit which selects one of the input-clock signal and the delayed clock signal;
    an output circuit which outputs data in synchronism with a clock signal selected by said clock-control circuit; and
    a DLL circuit which adjusts a delay of said variable-delay circuit,
    wherein said DLL circuit includes:
    a delay-control circuit which adjusts said delay of said variable-delay circuit; and
    a clock-selection circuit which controls said clock-control circuit to select one of the input-clock signal and the delayed clock signal,
    wherein said variable-delay circuit is controlled such that said delay is not increased when the input-clock signal is selected by said clock-selection circuit.

2. The semiconductor device as claimed in claim 1, wherein said clock-selection circuit compares phases between said input-clock signal and said delayed-clock signal, and selects one which has an earlier phase.

3. The semiconductor device as claimed in claim 1, wherein said DLL circuit further includes:
    a frequency divider which applies a frequency division to said input-clock signal; and
    a loop-control unit which controls said delay-control circuit through a feedback loop based on a signal obtained by said frequency division,
    wherein said clock-selection circuit lowers a ratio of said frequency division when said input-clock signal is selected.

4. The semiconductor device as claimed in claim 3, wherein said ratio of said frequency division is lowered when said delay-control circuit sets a maximum delay amount to said variable-delay circuit so as to result in an overflow condition.

5. The semiconductor device as claimed in claim 1, wherein said clock-selection circuit compares a first timing with a second timing where a first signal indicates said first timing which is delayed behind a predetermined timing of said input-clock signal by a fixed amount of delay, and a second signal indicates said second timing which is delayed behind said predetermined timing of said input-clock signal by a delay proportional to a cycle of said input-clock signal, and selects said input-clock signal when said second timing is behind said first timing.

6. The semiconductor device as claimed in claim 5, wherein said DLL circuit further includes:
- a frequency divider which applies a frequency division to said input-clock signal; and
- a loop-control unit which controls said delay-control circuit through a feedback loop based on a signal obtained by said frequency division,
- wherein said clock-selection circuit lowers a ratio of said frequency division when said input-clock signal is selected.

7. The semiconductor device as claimed in claim 6, wherein said ratio of said frequency division is lowered when said delay-control circuit sets a maximum delay amount to said variable-delay circuit so as to result in an overflow condition.

8. The semiconductor device as claimed in claim 6, further comprising a fixed-delay circuit which delays a third signal by said fixed amount of delay to generate said first signal, wherein said frequency divider generates said third signal and said second signal.

9. A semiconductor device comprising:
- a variable-delay circuit which delays an input-clock signal to generate a delay clock signal;
- a DLL circuit which adjusts a clock timing;
- a clock-control circuit which selects one of an input-clock signal and a delayed-clock signal adjusted by said DLL circuit; and
- an output circuit which outputs data in synchronism with a clock signal selected by said clock-control circuit,
- wherein said variable-delay circuit is controlled such that said delay is not increased when said input-clock signal is selected.

10. A semiconductor device comprising:
- a variable-delay circuit which delays an input-clock signal to generate a delay clock signal;
- a clock-control circuit which selects one of the input-clock signal and the delayed clock signal;
- an output circuit which outputs data in synchronism with a clock signal selected by said clock-control circuit; and
- a DLL circuit which adjusts a delay of said variable-delay circuit,
- wherein said variable-delay circuit is controlled such that said delay is not increased when the input-clock signal is selected in said clock-control circuit.

* * * * *